(12) United States Patent
Casarotti et al.

(10) Patent No.: US 6,688,662 B2
(45) Date of Patent: Feb. 10, 2004

(54) DETECTION AND HANDLING OF SEMICONDUCTOR WAFERS AND WAFER-LIKE OBJECTS

(75) Inventors: Sean A. Casarotti, Morgan Hill, CA (US); Alexander J. Berger, Palo Alto, CA (US); Frank E. Kretz, Santa Clara, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/116,462

(22) Filed: Apr. 2, 2002

(65) Prior Publication Data

US 2003/0052495 A1 Mar. 20, 2003

Related U.S. Application Data

(62) Division of application No. 09/632,236, filed on Aug. 4, 2000.

(51) Int. Cl.[7] ............................. A47J 45/00; B25J 15/06
(52) U.S. Cl. ...................... 294/64.3; 294/64.1; 414/941; 901/40
(58) Field of Search ............................. 294/1.1, 64.1, 294/64.3, 907; 414/937, 941; 901/33, 39, 40, 47, 49, 46; 118/500, 725, 728; 156/345

(56) References Cited

U.S. PATENT DOCUMENTS

| 3,438,668 | A |   | 4/1969  | Olsson et al. ............. 294/64.3 |
| 3,523,706 | A | * | 8/1970  | Logue ..................... 294/64.3 |
| 3,945,505 | A |   | 3/1976  | Frisbie et al. ............ 414/937 |
| 4,009,785 | A | * | 3/1977  | Trayes ..................... 294/64.3 |
| 4,029,351 | A |   | 6/1977  | Apgar et al. ............. 294/64 B |
| 4,566,726 | A |   | 1/1986  | Correnti et al. ........... 294/64.3 |
| 4,773,687 | A |   | 9/1988  | Bush et al. ............... 294/64.1 |
| 5,004,399 | A |   | 4/1991  | Sullivan et al. ........... 414/937 |
| 5,044,752 | A |   | 9/1991  | Thurfjell et al. .......... 414/937 |
| 5,169,196 | A |   | 12/1992 | Safabakhsh ............... 294/64.3 |
| 5,375,291 | A |   | 12/1994 | Tateyama et al. ........... 15/302 |
| 5,445,486 | A |   | 8/1995  | Kitayama et al. .......... 414/937 |

(List continued on next page.)

FOREIGN PATENT DOCUMENTS

| DE | 2631502    |   | 1/1978  | ............ 294/64.1 |
| DE | 3642937    |   | 8/1987  | ............ 414/941  |
| EP | 0807961 A1 |   | 11/1997 |                      |
| GB | 2334620    | * | 8/1999  |                      |
| JP | 0058480    |   | 5/1977  | ............ 294/64.1 |
| JP | 199337     |   | 9/1987  | ............ 294/64.1 |
| JP | 404341438  |   | 11/1992 | ............ 294/64.3 |
| JP | 408088202  | * | 4/1996  |                      |
| JP | 066578     |   | 3/1999  | ............ 294/64.1 |
| SU | 1320057    |   | 6/1987  | ............ 901/40   |
| SU | 1390022    |   | 4/1989  | ............ 901/40   |
| WO | WO 97/45862|   | 12/1997 |                      |

OTHER PUBLICATIONS

Burg et al., "Orienting Bernoulli Effect Wafer Transfer Mechanism", Nov. 1975, IBM Techincal Disclosure Bulletin.*

Primary Examiner—Eileen D. Lillis
Assistant Examiner—Paul T. Chin
(74) Attorney, Agent, or Firm—Michael Shenker; MacPherson Kwok Chen & Heid LLP

(57) ABSTRACT

An end-effector includes multiple vortex chucks for supporting a wafer. Vortex chucks are located along the periphery of the end-effector to help prevent a flexible wafer from curling. The end-effector has limiters to restrict the lateral movement of a supported wafer. In one example, the end-effector has a detector for detecting the presence of a wafer. The detector is mounted at a shallow angle to allow the end-effector to be positioned close to a wafer to be picked-up, thereby allowing detection of deformed wafers contained in a wafer cassette. The shallow angle of the detector also minimizes the thickness of the end-effector. Also disclosed is a wafer station with features similar to that of the end-effector.

14 Claims, 12 Drawing Sheets

U.S. PATENT DOCUMENTS

| | | | |
|---|---|---|---|
| 5,452,078 A | 9/1995 | Cheng | 356/150 |
| 5,456,179 A | 10/1995 | Lamelot | 102/213 |
| 5,492,566 A * | 2/1996 | Sumnitsch | 118/500 |
| 5,513,668 A * | 5/1996 | Sumnitsch | 134/157 |
| 5,540,098 A | 7/1996 | Ohsawa | 414/937 |
| 5,546,179 A | 8/1996 | Cheng | 356/73 |
| 5,556,147 A | 9/1996 | Somekh et al. | 294/64.1 |
| 5,622,400 A | 4/1997 | George | 414/941 |
| 5,647,626 A | 7/1997 | Chen et al. | 294/1.1 |
| 5,669,752 A | 9/1997 | Moon | 414/941 |
| 5,746,460 A | 5/1998 | Marohi et al. | 414/941 |
| 5,765,889 A | 6/1998 | Nam et al. | 294/64.1 |
| 5,767,627 A | 6/1998 | Siniaguine | 315/111.41 |
| 5,863,170 A | 1/1999 | Boitnott et al. | 414/937 |
| 5,870,488 A | 2/1999 | Rush et al. | 382/151 |
| 5,911,461 A | 6/1999 | Sauter et al. | 414/941 |
| 5,967,578 A | 10/1999 | Frey | 414/941 |
| 6,013,920 A | 1/2000 | Gordon et al. | 250/559.36 |
| 6,032,997 A | 3/2000 | Elliott et al. | 901/40 |
| 6,040,548 A | 3/2000 | Siniaguine | 219/121.48 |
| 6,067,977 A | 5/2000 | Wark et al. | 125/35 |
| 6,083,811 A | 7/2000 | Riding et al. | 438/460 |
| 6,095,582 A | 8/2000 | Siniagune et al. | 414/94.1 |
| 6,099,056 A | 8/2000 | Siniagune et al. | 294/64.1 |
| 6,109,677 A | 8/2000 | Anthony | 414/941 |
| 6,113,165 A | 9/2000 | Wen et al. | 901/46 |
| 6,139,678 A | 10/2000 | Siniaguine | 156/345 |
| 6,164,894 A | 12/2000 | Cheng | 414/416 |
| 6,168,697 B1 * | 1/2001 | Siniaguine et al. | 118/728 |
| 6,174,011 B1 | 1/2001 | Keigler | 294/1.1 |
| 6,176,023 B1 | 1/2001 | Doche | 34/451 |
| 6,183,026 B1 | 2/2001 | Cai et al. | 294/64.1 |
| 6,183,183 B1 | 2/2001 | Goodwin et al. | 414/941 |
| 6,184,060 B1 | 2/2001 | Siniaguine | 438/106 |
| 6,187,103 B1 | 2/2001 | Huang et al. | 414/941 |
| 6,198,976 B1 | 3/2001 | Sundar et al. | 700/59 |
| 6,199,927 B1 | 3/2001 | Shamlou et al. | 294/64.1 |
| 6,202,482 B1 | 3/2001 | Blew et al. | 73/159 |
| 6,203,622 B1 * | 3/2001 | Halpin et al. | 118/725 |
| 6,206,441 B1 | 3/2001 | Wen et al. | 901/46 |
| 6,217,034 B1 | 4/2001 | Smedt et al. | 279/106 |
| 6,220,808 B1 | 4/2001 | Bonora et al. | 414/217 |
| 6,244,641 B1 | 6/2001 | Szapucki et al. | 294/64.1 |

* cited by examiner

DETECTION AND HANDLING OF SEMICONDUCTOR WAFERS AND WAFER-LIKE OBJECTS

CROSS REFERENCE TO RELATED APPLICATIONS

The present application is a division of U.S. patent application Ser. No. 09/632,236 filed Aug. 4, 2000 and incorporated herein by reference.

BACKGROUND OF THE INVENTION

1. Field of the Invention

The present invention generally relates to semiconductor wafer processing, and more particularly to methods and associated apparatus for handling semiconductor wafers and wafer-like objects.

2. Description of the Related Art

In a semiconductor wafer processing system, semiconductor wafers are transferred from one station to another using a manipulator such as a robot. A typical robot used in the semiconductor industry has a body, an arm, and an end-effector attached to the arm. The end-effector is the part of the robot that supports a wafer.

Conventional end-effectors are ineffective in supporting flexible and/or deformed wafers. For example, end-effectors employing vacuum suction do not adequately support a deformed wafer because vacuum sealing requires a relatively flat surface. End-effectors that support a wafer from the bottom by gravity are also ineffective because deformed wafers have unpredictable shapes, and thus cannot provide an end-effector a consistent bottom surface contact area.

End-effectors utilizing the Bernoulli principle are likewise inadequate to support wafers that are not relatively flat. Existing Bernoulli end-effectors can only accommodate 1 to 2 millimeters (mm) of deformation for every 150 mm of length whereas wafer deformation can exceed 8 mm as substrates and deposited films get thinner.

PCT Application WO 97/45862, published Dec. 4, 1997 shows an end-effector that uses vortex chucks to support a wafer. While the end-effector in the aforementioned PCT application is generally more effective in handling flexible wafers than current non-vortex designs, that end-effector does not have, at least, an effective means for detecting and supporting very thin, flexible wafers.

SUMMARY

The present invention relates to a method and associated apparatus for handling relatively non-flat wafers and wafer-like objects. The invention can be employed in a semiconductor wafer processing system and generally for transporting objects including flat panel displays, very thin wafers, and deformed wafers.

An end-effector in accordance with one embodiment includes multiple vortex chucks for supporting a wafer. Vortex chucks are located along the periphery of the end-effector to help prevent a flexible wafer from curling. The end-effector has limiters to restrict the lateral movement of the supported wafer.

In one embodiment, the limiters are retractable to allow the end-effector to press a supported wafer against a surface (e.g., sticky tape). In one example, the limiters are spring loaded pins which retract as the end-effector presses the supported wafer against the surface.

In one embodiment, an edge of the end-effector is chamfered to prevent a flexible wafer from contacting a sharp portion of the end-effector.

In one embodiment, the end-effector has an outline which follows that of the center cut-out portion of a conventional wafer cassette to increase the area of the end-effector for supporting a wafer.

In one embodiment, the end-effector has a detector for detecting the presence of a wafer. The detector is mounted at a shallow angle to allow the end-effector to be positioned close to a wafer to be picked-up, thereby allowing detection of deformed wafers contained in a wafer cassette. The shallow angle of the detector also minimizes the thickness of the end-effector.

A wafer station in accordance with one embodiment includes multiple vortex chucks for supporting a wafer. Vortex chucks are located along the periphery of the station to fully support a flexible wafer.

In one embodiment, the top surface of the wafer station is very flat and has a very smooth finish so that a wafer that is curled down can be picked-up from the station without damaging the edges of the wafer as the wafer curls up during the pick-up step.

In one embodiment, the wafer station has a hole in the middle to accommodate various detectors for detecting the presence of a wafer.

These and other features of the invention will be apparent to a person of ordinary skill in the art upon reading the following detailed description and figures.

BRIEF DESCRIPTION OF THE DRAWINGS

The use of the same reference symbol in different figures indicates the same or identical elements.

DETAILED DESCRIPTION

Figure 1A:
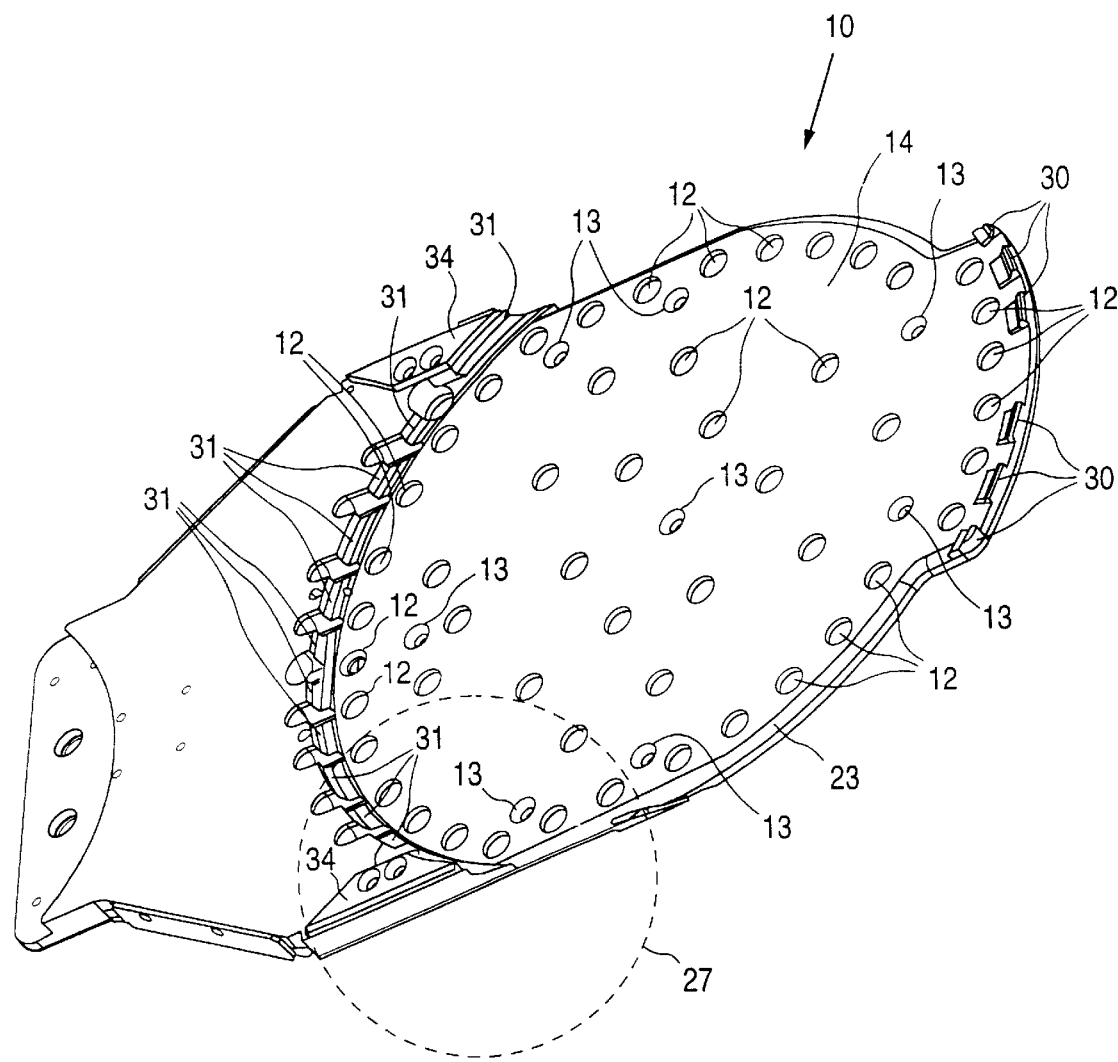
FIGS. 1A–1E show various views of an end-effector in one embodiment.

FIG. 1A shows a three-dimensional view of an end-effector 10 in accordance with an embodiment of the invention. In a typical application, end-effector 10 is attached to an arm of a conventional robot for picking-up and placing semiconductor wafers in a semiconductor manufacturing equipment. In one example, end-effector 10 is utilized in the TRU-ETCH 2000/3000™ wafer processing system from Tru-Si Technologies, Inc. of Sunnyvale, Calif. Of course, the invention is not so limited and can be generally used for transporting semiconductor wafers and wafer-like objects.

Referring to FIG. 1A, end-effector 10 includes multiple vortex chucks 12 for supporting a semiconductor wafer. Only some vortex chucks 12 are labeled in FIG. 1A for clarity. Vortex chucks are also described in the following documents: PCT Application WO 97/45862; European Patent Application EP 0 807 964 A1; U.S. patent application Ser. No. 09/038,642, "HOLDERS SUITABLE TO HOLD ARTICLES DURING PROCESSING, AND ARTICLE PROCESSING METHODS", filed on Mar. 10, 1998, now U.S. Pat. No. 6,168.697; U.S. patent application Ser. No. 09/041,284, "ARTICLE HOLDERS AND HOLDING METHODS", filed on Mar. 11, 1998, now U.S. Pat. No. 6,095.582; U.S. Patent Application No. 09/456,135, "NON-CONTACT WORKPIECE HOLDER", filed on Dec. 7, 1999, now U.S. Pat. No. 6,402,843; and U.S. patent application Ser. No. 09/633,086, entitled "NON-CONTACT WORKPIECE HOLDER USING VORTEX CHUCK WITH CENTRAL GAS FLOW", by inventor Sam Kao, filed on Aug. 4, 2000, now U.S. Pat. No. 6,427,991. The above documents are incorporated herein by reference in their entirety. The aforementioned U.S. patent applications are assigned to Tru-Si Technologies, Inc., the assignee of the present invention.

Figure 2A:
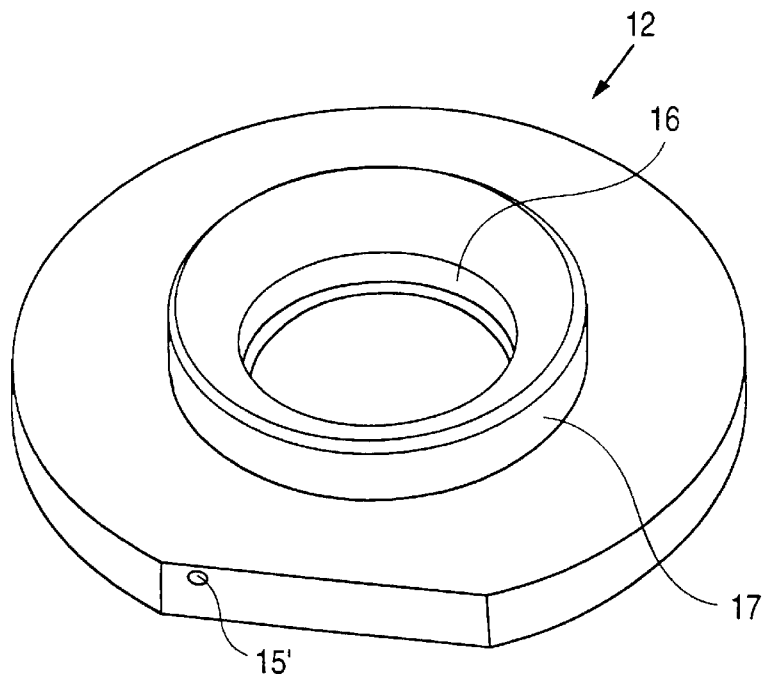
FIGS. 2A and 2B show a three-dimensional view and a wireline view, respectively, of a vortex chuck.
Figure 2B:
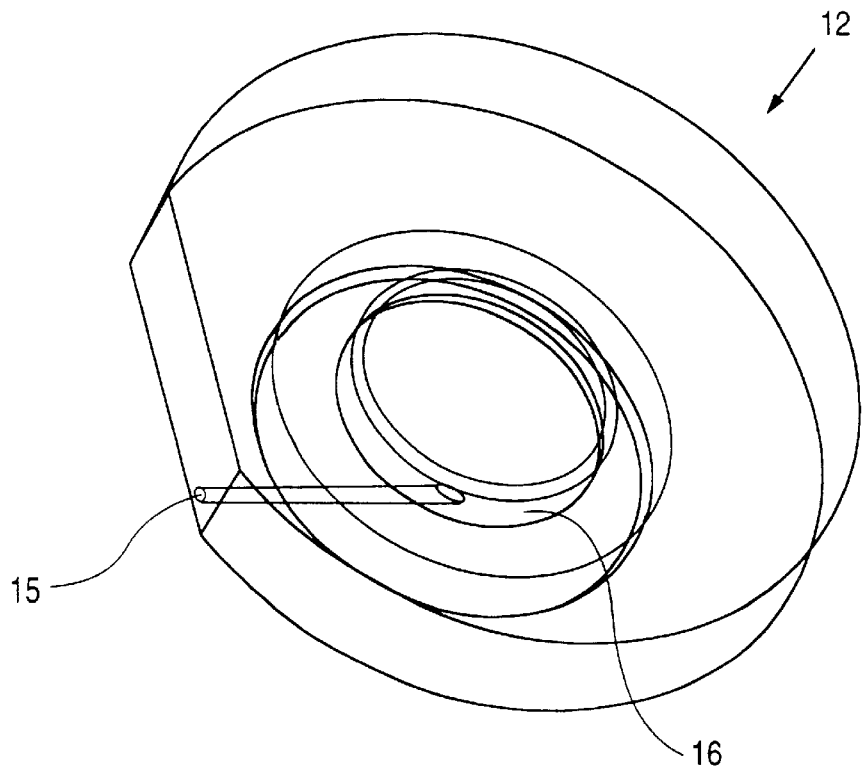

FIGS. 2A and 2B show a three-dimensional view and a wireline view, respectively, of a vortex chuck 12. Pressurized gas (e.g., air, nitrogen) is fed into an inlet 15, follows the curvature of a wall 16, and exits a chamber 17 through an open portion. The foregoing actions form a vortex that creates a varying pressure differential distribution extending radially from the center of vortex chuck 12. The varying pressure differential distribution holds a wafer in place without contacting the wafer.

Figure 1B:
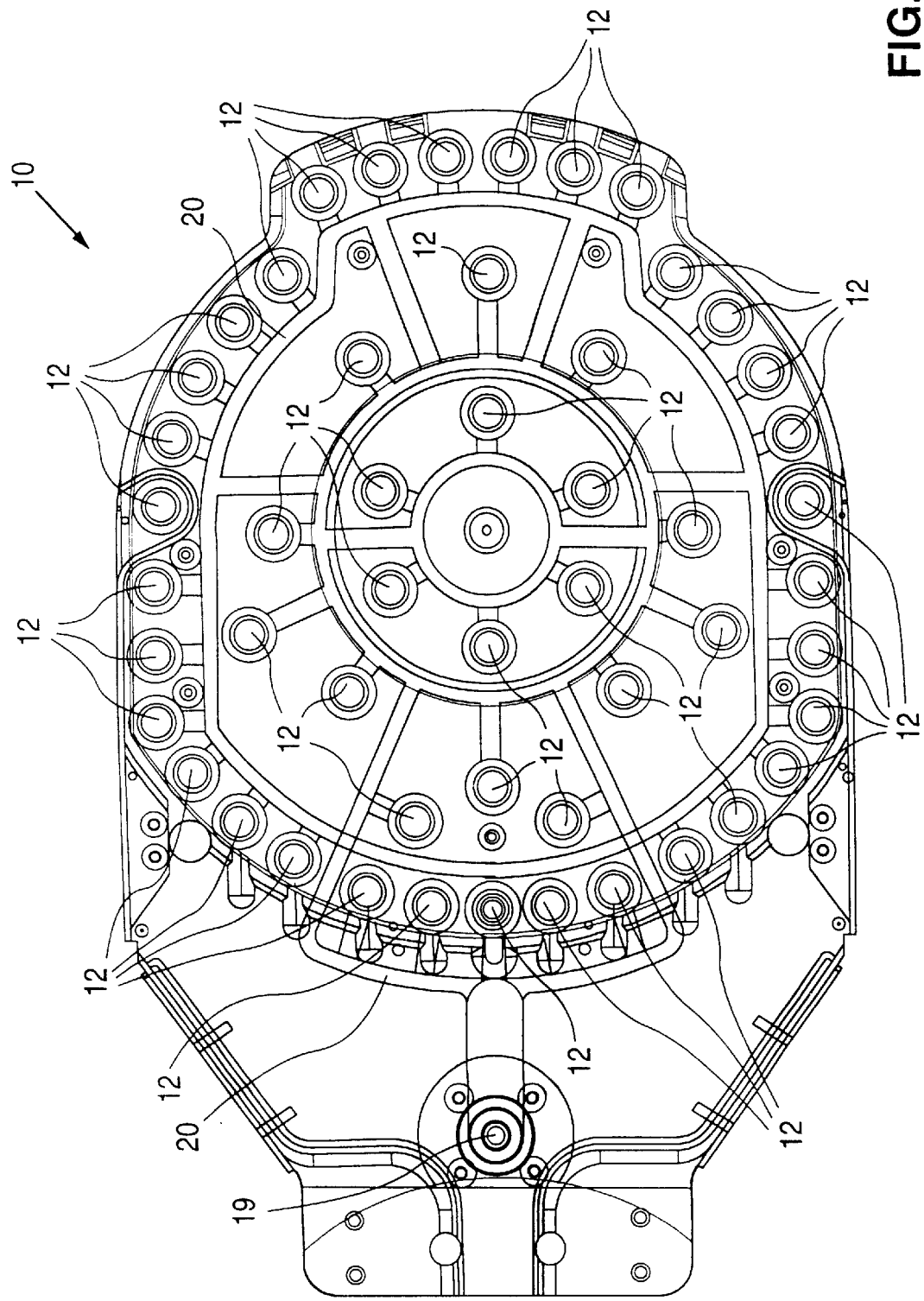
Figure 1C:
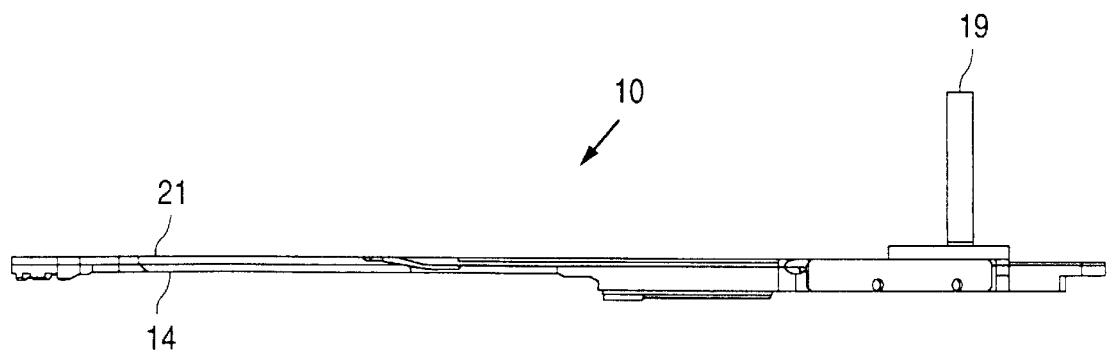

As shown in FIG. 1B, a top X-ray view of end-effector effector 10, pressurized gas introduced through a main inlet 19 is distributed to all vortex chucks 12 via an injection channel 20. In one example, vortex chucks 12 are sandwiched between a bottom plate 14 and a top plate 21 shown in the side view of FIG. 1C. Bottom plate 14 and top plate 21 are conventionally fastened together. Injection channel 20 can be machined in top plate 21, bottom plate 14, or both. In one example, main inlet 19 has a diameter of 0.25" (i.e., 0.25 inch) to 0.375" while injection channel 20 is a square channel having a cross-sectional dimension of 0.10"×0.10" to 0.20"×0.20". Inlet 15 (FIGS. 2A and 2B) of each vortex chuck 12 is coupled to receive pressurized gas from injection channel 20. Each hole in bottom plate 14 where a vortex chuck 12 fits through is sealed (e.g., by using an o-ring or by gluing) to prevent gas leaks. In one example, each vortex chuck hole in bottom plate 14 is 0.28" in diameter.

As illustrated in FIGS. 1A and 1B, vortex chucks 12 are located in the middle section, in the center section, and along the periphery of end-effector 10. The additional vortex chucks 12 on the periphery support the outermost portions of a wafer and thereby help prevent the wafer from curling. This makes end-effector 10 specially suitable for supporting very thin, flexible wafers such as those having a thickness of 150 µm or less. The additional vortex chucks 12 also help prevent the wafer from contacting end-effector 10 by increasing the volume of gas flowing between end-effector 10 and the wafer. The increased gas volume results in more air protection between the wafer and end-effector 10, thereby decreasing the possible points of contact between the two. A person of ordinary skill in the art will appreciate that the number and placement of vortex chucks 12 depend on, among other considerations, the size and type of the wafer to be supported. Preferably, the peripheral vortex chucks 12 are located as close to the outside edge of end-effector 10 as possible. In one example, the center of each vortex chuck 12 on the periphery of end-effector 10 is located 0.15" to 0.35" from the outside edge of end-effector 10.

Figure 1D:
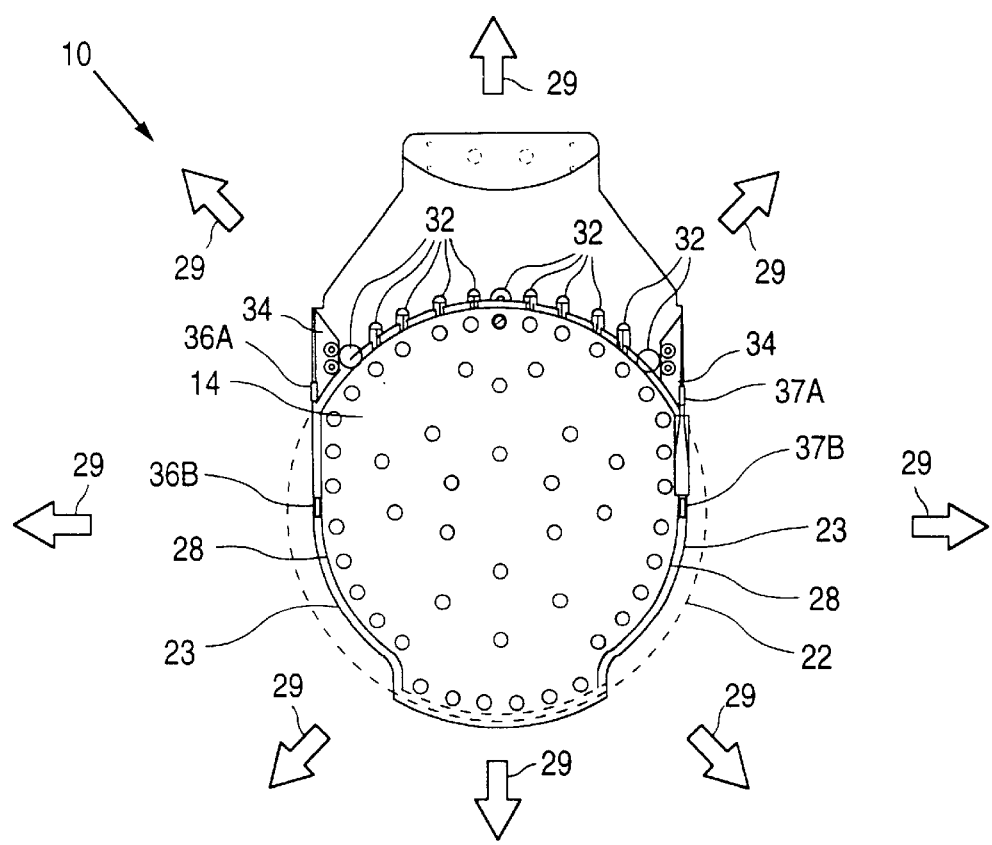

In one embodiment, each vortex chuck 12 is physically oriented such that its exit gas uniformly flows outwards of end-effector 10 as schematically illustrated by arrows 29 in the top view of FIG. 1D. This orientation of vortex chucks 12 keeps a supported wafer relatively stable. Referring to FIG. 1A, rear retaining lips 31 and front retaining lips 30 are provided to limit the lateral movement of the supported wafer. In one example where the distance between the supported wafer and bottom plate 14 (also known as the wafer's flying height) ranges from 0.008" to 0.026", the topmost portion of front retaining lips 30 is 0.050" from bottom plate 14 while that of rear retaining lips 31 is 0.180". Of course, the flying height of the supported wafer will vary depending on, among other considerations, the number and location of vortex chucks used, the size and type of the wafer, and the pressure of the gas provided to the vortex chucks. Thus, the height of front retaining lips 30 and rear retaining lips 31 depends on the specifics of the application and is selected such that the supported wafer is confined by end-effector 10.

Figure 1E:
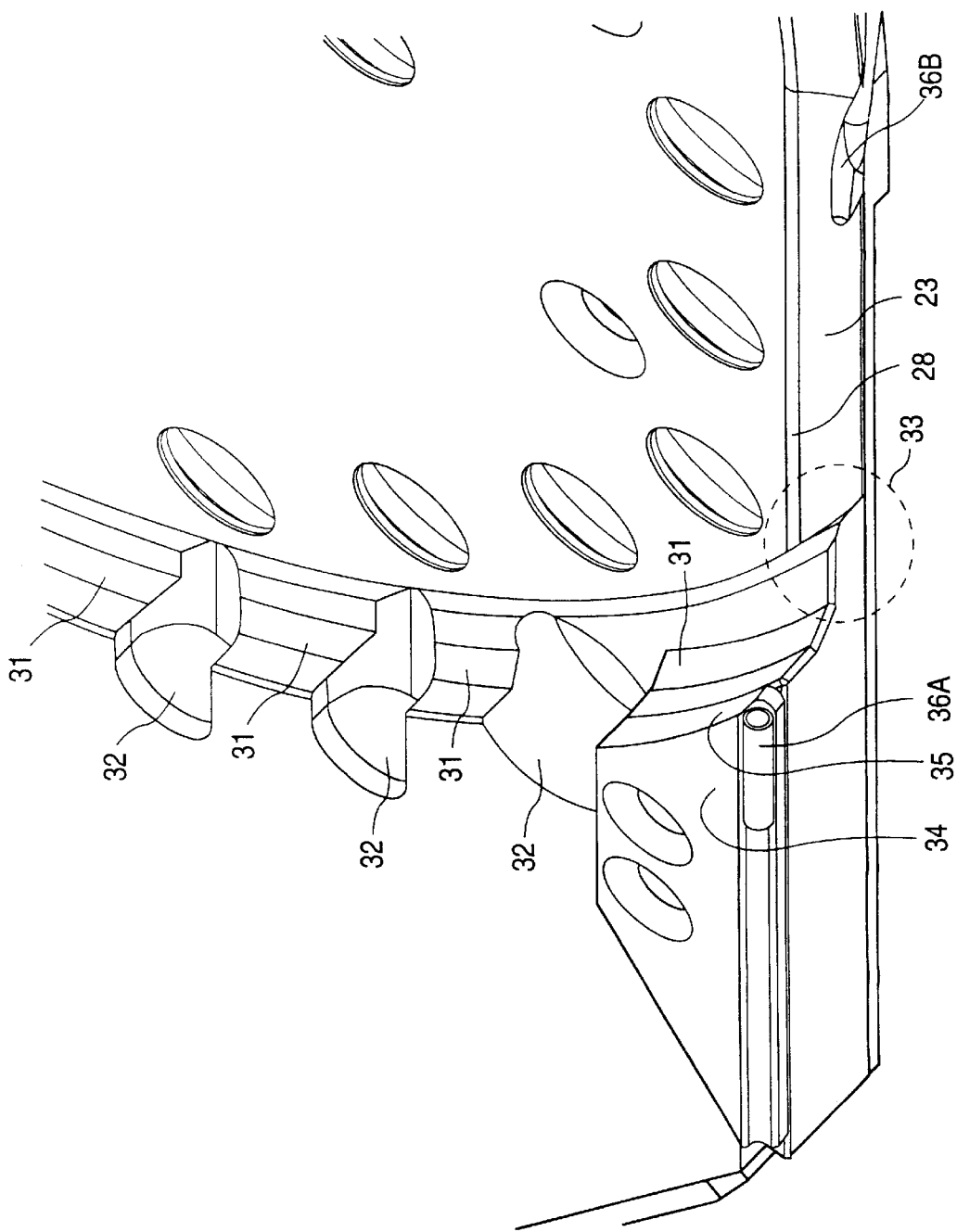

Referring to FIG. 1D, cavities 32 are provided adjacent to vortex chucks 12 that are near rear retaining lips 31. FIG. 1E, a magnified view of portion 27 shown in FIG. 1A, provides a closer view of some cavities 32. Cavities 32 provide a path for gases exiting from vortex chucks 12 to escape rearward of end-effector 10, thereby preventing the gases from building up on rear retaining lips 31 and causing wafer instability. Cavities 32 are conventionally machined in the block including rear retaining lips 31.

In one embodiment, outside edge 23 of end-effector 10, shown in FIGS. 1D and 1E, is chamfered to prevent a supported wafer from touching a sharp portion of end-effector 10 when the wafer curls. Chamfer 28 of outside edge 23, in one example, is chamfered at a ratio of 2.5:1 to 1.5:1. As illustrated in dashed section 33 of FIG. 1E, the structure that includes rear retaining lips 31 extends past outside edge 23 to provide additional wafer support and help prevent the wafer from contacting end-effector 10.

In one embodiment, end-effector 10 includes pick-up blocks 34 shown in FIG. 1D. FIG. 1E shows a closer view of one of the pick-up blocks 34. During a wafer pick-up step, surface 35 of each pick-up block 34 contacts an edge of the wafer and slides the wafer 0.05" to 0.15" into a position within a pick-up window, which is a designated area where a wafer is expected to be found for pick-up. The capability to slide a wafer into the pick-up window enables end-effector 10 to pick-up the wafer even if the wafer is not exactly within the pick-up window.

Figure 3A:
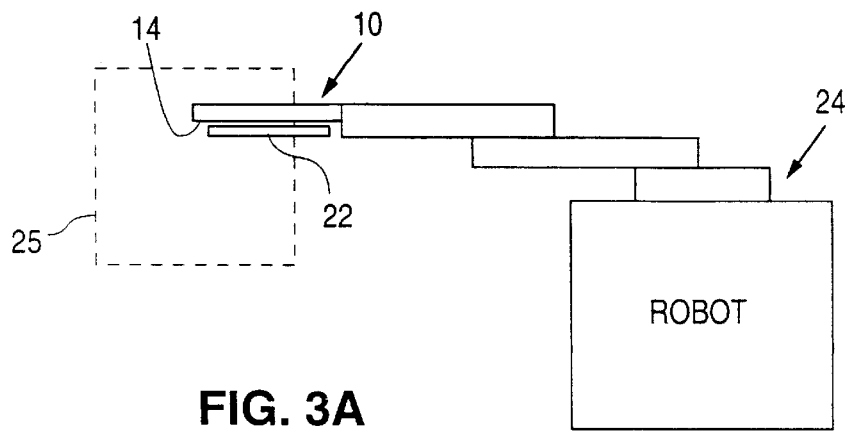
FIG. 3A shows a schematic diagram of the end-effector shown in FIGS. 1A–1E used with a robot.

FIG. 3A is a schematic representation of an end-effector 10 being extended by a robot 24 to place a wafer 22 into a conventional wafer holder such as a cassette 25. As illustrated in FIG. 3A, end-effector 10 picks-up and supports wafer 22 from the top (i.e., device side of the wafer), with the top of wafer 22 facing bottom plate 14. Of course, end-effector 10 can also support a wafer from the bottom. Robot 24 can be any conventional robot used in the semiconductor industry including the model GB8 from Genmark Automation, Inc. of Sunnyvale Calif. End-effector 10 is conventionally attached to an arm of robot 24. Robot 24 includes a conventional control system (not shown) for directing the movement and operation of robot 24.

Figure 3B:
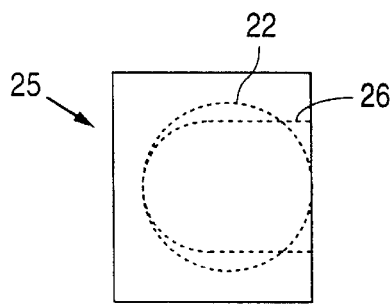
FIG. 3B shows a top x-ray view of a wafer cassette.

FIG. 3B shows a top X-ray view of cassette 25. Just like any conventional wafer cassette, cassette 25 includes a center cut-out portion 26. In one embodiment, end-effector 10 has an outline, defined by outside edge 23 shown in FIG. 1D, which follows that of center-cut-out portion 26. That outline increases end-effector 10's support area and thus provides increased wafer support. FIG. 1D shows the extent of outside edge 23 relative to the diameter of supported wafer 22. In one example, end-effector 10 has an outline which follows that of the center cut-out portion of a conventional 200 mm wafer cassette.

Figure 3C:
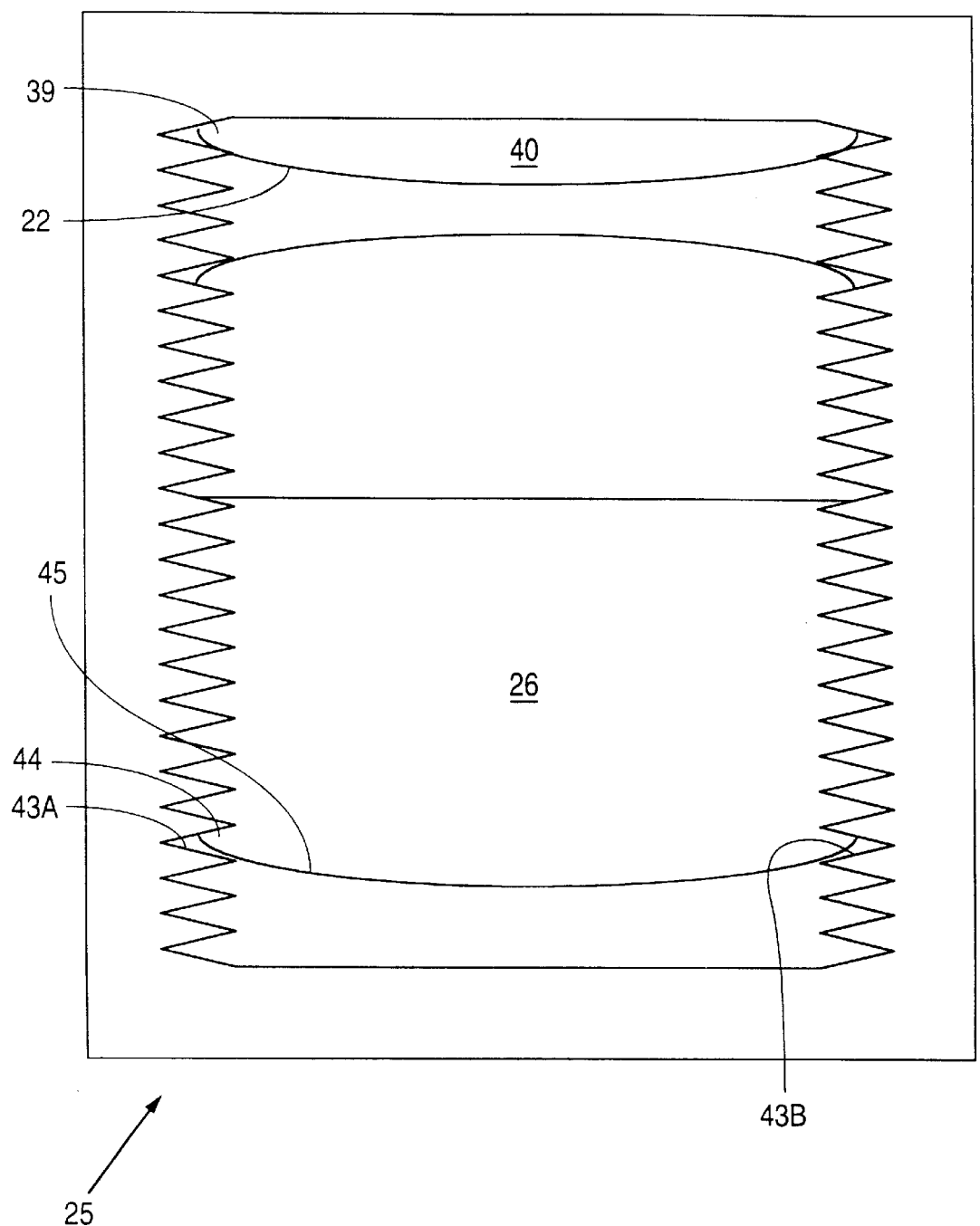
FIG. 3C shows a front view of a wafer cassette.

FIG. 3C shows a front view of cassette 25. Cassette 25 has multiple slots, with each slot having two shoulders for supporting the wafer. In FIG. 3C for example, wafer 45 is resting on shoulders 43A and 43B of slot 44. To pick up a wafer from cassette 25, end-effector 10 is first extended to the topmost portion 40. End-effector 10 is then lowered down center cut-out portion 26 until end-effector 10 detects a wafer, such as wafer 22 in slot 39. Thereafter, end-effector 10 picks-up the detected wafer.

In one embodiment, end-effector 10 includes a detector for detecting the presence of a wafer. Referring to FIG. 1D, fiber optics 36A and 36B (also shown in FIG. 1E and FIG. 4) on one side of end-effector 10 are provided to detect the portion of a wafer resting on one shoulder of a slot while fiber optics 37A and 37B are provided on the other side of end-effector 10 to detect the portion of the wafer on the other shoulder of the slot. Utilizing a pair of fiber optics on each side of end-effector 10 allows detection of a cross-slotted wafer, which is a single wafer occupying two slots. If a wafer is detected by fiber optics 36A and 36B but not fiber optics 37A and 37B, an alarm is generated to alert a human operator that a wafer in the cassette is likely to be cross-slotted.

As end-effector 10 is lowered from topmost portion 40 of cassette 25, gas pressure that is a fraction of the gas pressure required to firmly hold a wafer is flown into main inlet 19 (FIGS. 1B and 1C) to partially activate vortex chucks 12, thereby attracting and slightly flattening out a bowed wafer in the path of end-effector 10. As the bowed wafer flattens out, the fiber optics on each side of end-effector 10 detect the portions of the wafer resting on the shoulders of the slot. After detecting the wafer, sufficient gas pressure is then flown into main inlet 19 to pick-up and hold the wafer. In one example, the gas pressure to firmly hold the wafer is 5 psi to 40 psi (pounds per square inch) at a flow rate of 30 slpm to 100 slpm (standard liters per minute) while the gas pressure to slightly flatten out a bowed wafer is 1.5 psi to 5 psi at a flow rate of 5 slpm to 30 slpm.

Further details regarding the detector configuration on the sides of end-effector 10 are now described with reference to fiber optics 36A and 36B. However, the same description also applies to fiber optics 37A and 37B. Referring to FIG. 1E, fiber optics 36A and 36B are conventional fiber optic cables mounted on one side of end-effector 10. In one example, fiber optic 36A is mounted on a groove of pick-up block 34 while fiber optic 36B is mounted on a groove of outside edge 23. Fiber optics 36A and 36B are conventionally attached (e.g., glued) in place.

Figure 4:
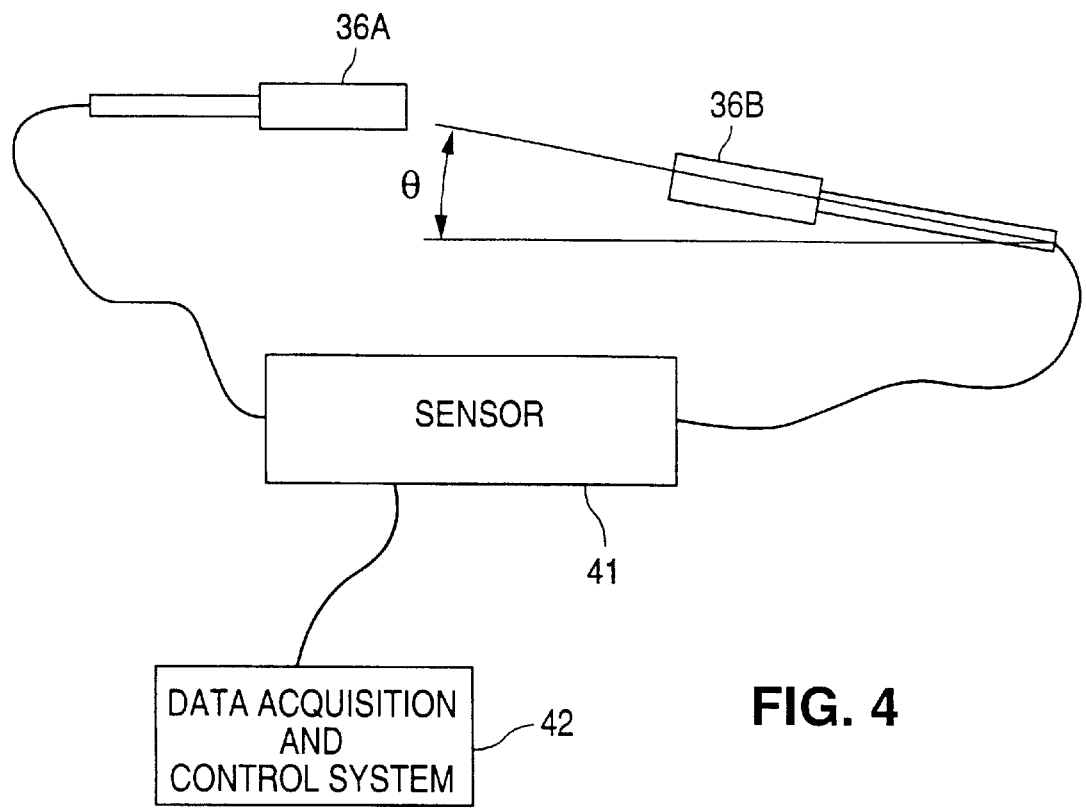
FIG. 4 shows a schematic diagram of a detector configuration in one embodiment.

As shown in the schematic diagram of FIG. 4, fiber optics 36A and 36B are coupled to a conventional sensor 41. Light beam emitted from fiber optic 36B is received by fiber optic 36A (or vice versa) and detected by sensor 41. Sensor 41 detects when the light beam is broken, for example by a wafer between fiber optic 36A and fiber optic 36B, and accordingly informs a conventional data acquisition and control system 42 (e.g., a computer or a programmable controller) coupled to robot 24. In one example, fiber optics 36A and 36B are of the same type as the part number LL3-TR03-2 fiber optics from SICK, Inc. (sickoptic.com) while sensor 41 is of the same type as the FX-7 sensor from SUNX Ltd. (sunx-ramco.com). Other conventional detectors can also be used. For example, a person of ordinary skill in the art will appreciate that fiber optic 36A, fiber optic 36B, and sensor 41 can be replaced with a beam break detector consisting of a transmitter and a receiver.

The angle of fiber optic 36B, shown in FIG. 4 as angle θ, with respect to an ideally flat wafer supported by end-effector 10 is relatively shallow (e.g., 6° to 12°) so that the fiber optics can be positioned close to the shoulders of a cassette slot, thereby allowing detection of deformed wafers. In one example, end-effector 10 can be moved such that fiber optics are 0.05" to 0.25" from the shoulders of a cassette slot. The shallow angle of fiber optic 36B also helps keep the thickness of end-effector 10 to a minimum. Further, the angle of fiber optic 36B allows detection of transparent wafers because transparent wafers will reflect the light beam emitted from such a shallow angle, thereby preventing the light beam from reaching fiber optic 36A.

Figure 5:
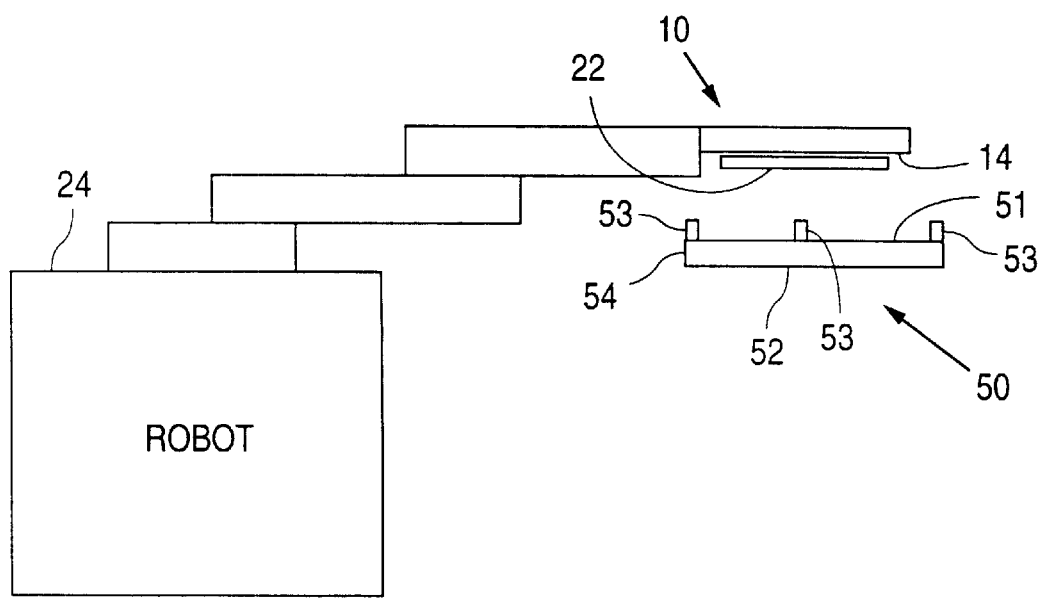
FIG. 5 shows a schematic diagram of the end-effector shown in FIGS. 1A–1E used with a wafer station in one embodiment.

In one embodiment, end-effector 10 is used together with a wafer station 50 shown in the schematic diagram of FIG. 5. A wafer station is generally a location where a wafer can be placed. It is to be noted that wafer station 50 can be employed independent of end-effector 10. Station 50 can be used in a variety of wafer handling apparatus including wafer pods, intermediate stations, carousels, and shuttles.

Station 50 has vortex chucks 12 for supporting a wafer from the bottom of the wafer (i.e., a supported wafer is on top of station 50). However, station 50 can also support a wafer from the top. The vortex chucks 12 in station 50 are sandwiched between a top plate 51 and a bottom plate 52, which are conventionally fastened together. The holes in top plate 51 where vortex chucks 12 fit through are sealed (e.g., with an o-ring or by gluing) to prevent gas leaks. In one example, each vortex chuck hole in top plate 51 is 0.28" in diameter. Limiting pins 53 are provided on the periphery of station 50 to prevent a supported wafer from laterally slipping out. In one example, limiting pins 53 are 0.10" to 0.25" tall as measured from top plate 51.

Figure 6A:
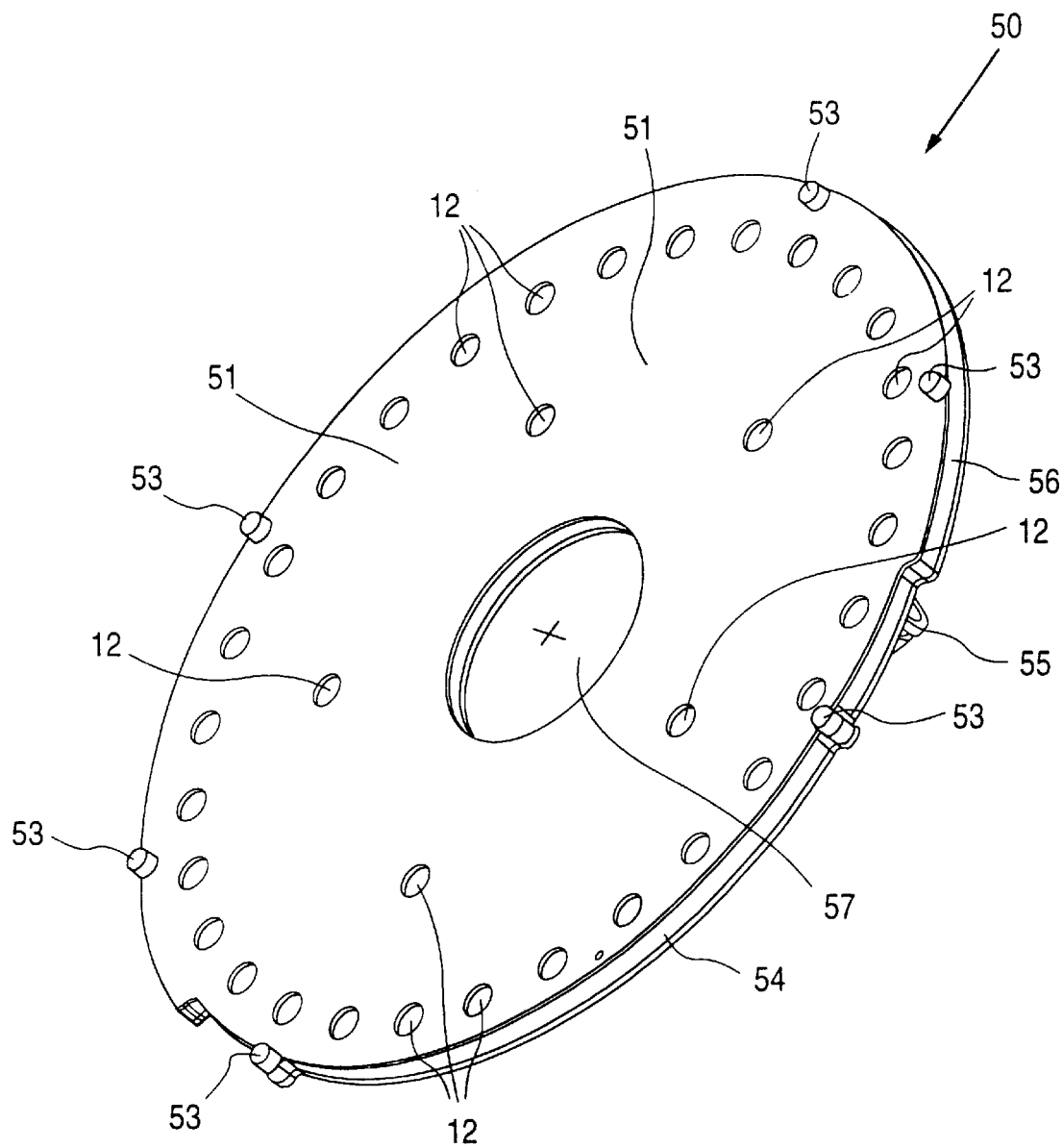
FIG. 6A shows a three-dimensional view of a wafer station in one embodiment.

FIG. 6A shows a three-dimensional view of station 50. Only some vortex chucks 12 are labeled in FIG. 6A for clarity. As shown in FIG. 6A, station 50 has vortex chucks 12 on its periphery and middle section for supporting a flexible wafer. Preferably, the peripheral vortex chucks 12 are located as close as possible to the outer diameter of station 50. In one example where station 50 has an outer diameter of 7.5" to 8.5" to accommodate a 200 mm wafer, there are thirty (30) equally spaced vortex chucks 12 on the periphery of station 50 that are disposed along a circle having a diameter of 6.5" to 7.5". In the same example, there are five (5) equally spaced vortex chucks 12 that are disposed along a circle having a diameter of 2.5" to 5.5". Station 50 has a main inlet 55 for accepting pressurized gas.

In one embodiment, the center section of station 50 has a hole 57 to allow a detector (not shown) from above or underneath station 50 to detect the presence of a wafer. Any conventional sensor can be used including beam break and reflective sensors. In one example, hole 57 is 2.0" in diameter.

In one embodiment, the surface of top plate 51 is very flat and has a very smooth finish so that a wafer that is curled down can be picked-up from station 50 without damaging the edges of the wafer as the wafer curls up towards end-effector 10 during the pick-up step. In one example, the surface of top plate 51 has a finish of approximately 6 RA to 32 RA (Roughness Average) and a flatness of approximately 0.001" to 0.010". Conventional machining practices are used to achieve the aforementioned finish and flatness.

Optionally, station 50 has a notched portion 54 (also shown in FIG. 5) to make room for rear retaining lips 31 of end-effector 10. This allows end-effector 10 to be positioned close to station 50. Whether notched portion 54 is required or not depends on the dimensions of the end-effector used. In one example, notched portion 54 has a diameter of 7.0" to 8.0" while outside edge 56 has a diameter of 7.5" to 8.5".

Figure 6B:
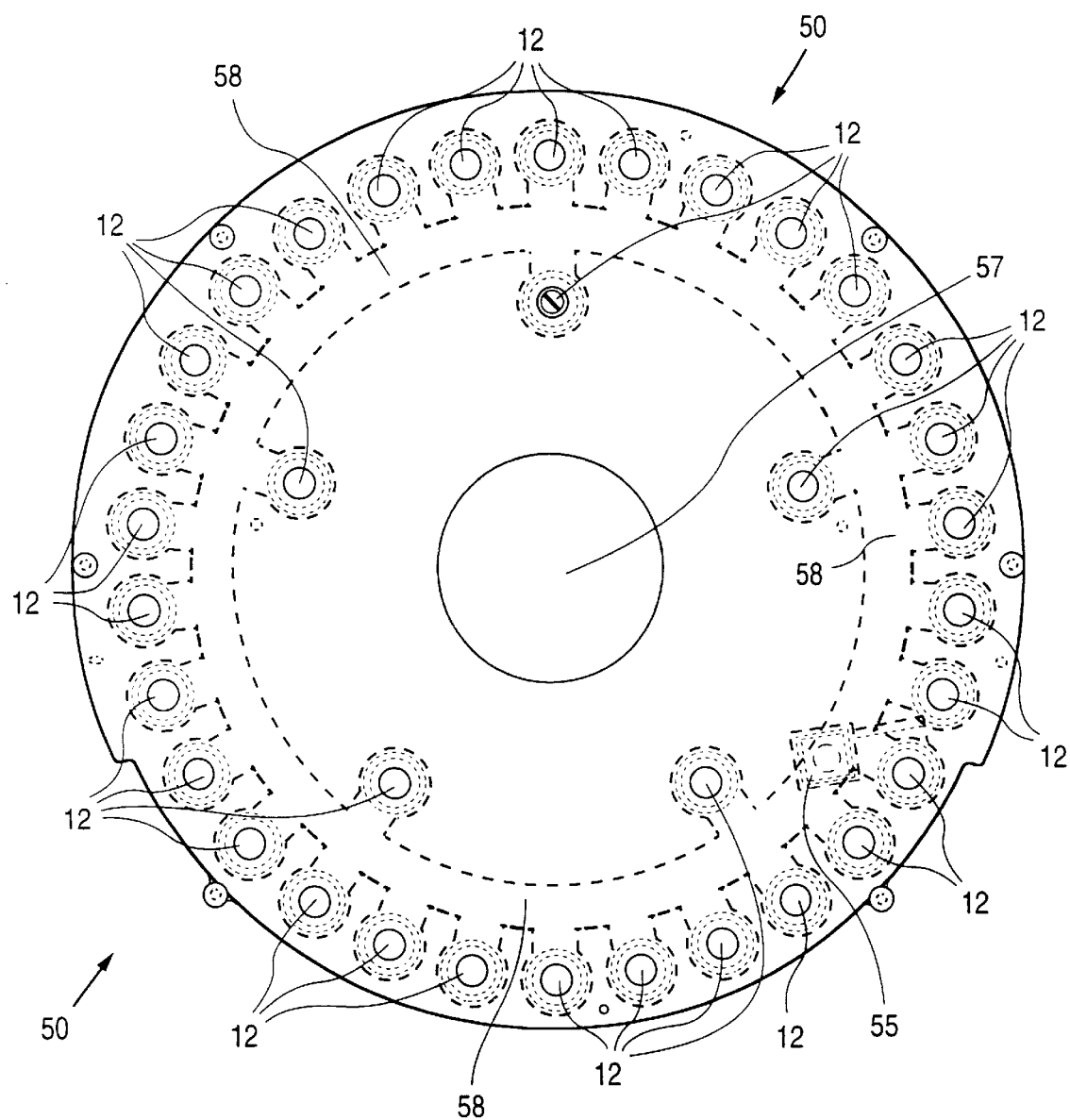
FIG. 6B shows a top x-ray view of the wafer station shown in FIG. 6A.

Referring to FIG. 6B, which shows a top x-ray view of station 50, pressurized gas introduced through main inlet 55 passes through injection channel 58 to inlet 15 of vortex chucks 12 (FIGS. 2A and 2B). In one example, injection channel 58 is a rectangular channel with a cross-sectional dimension of 0.375"×0.10".

Figure 6C:
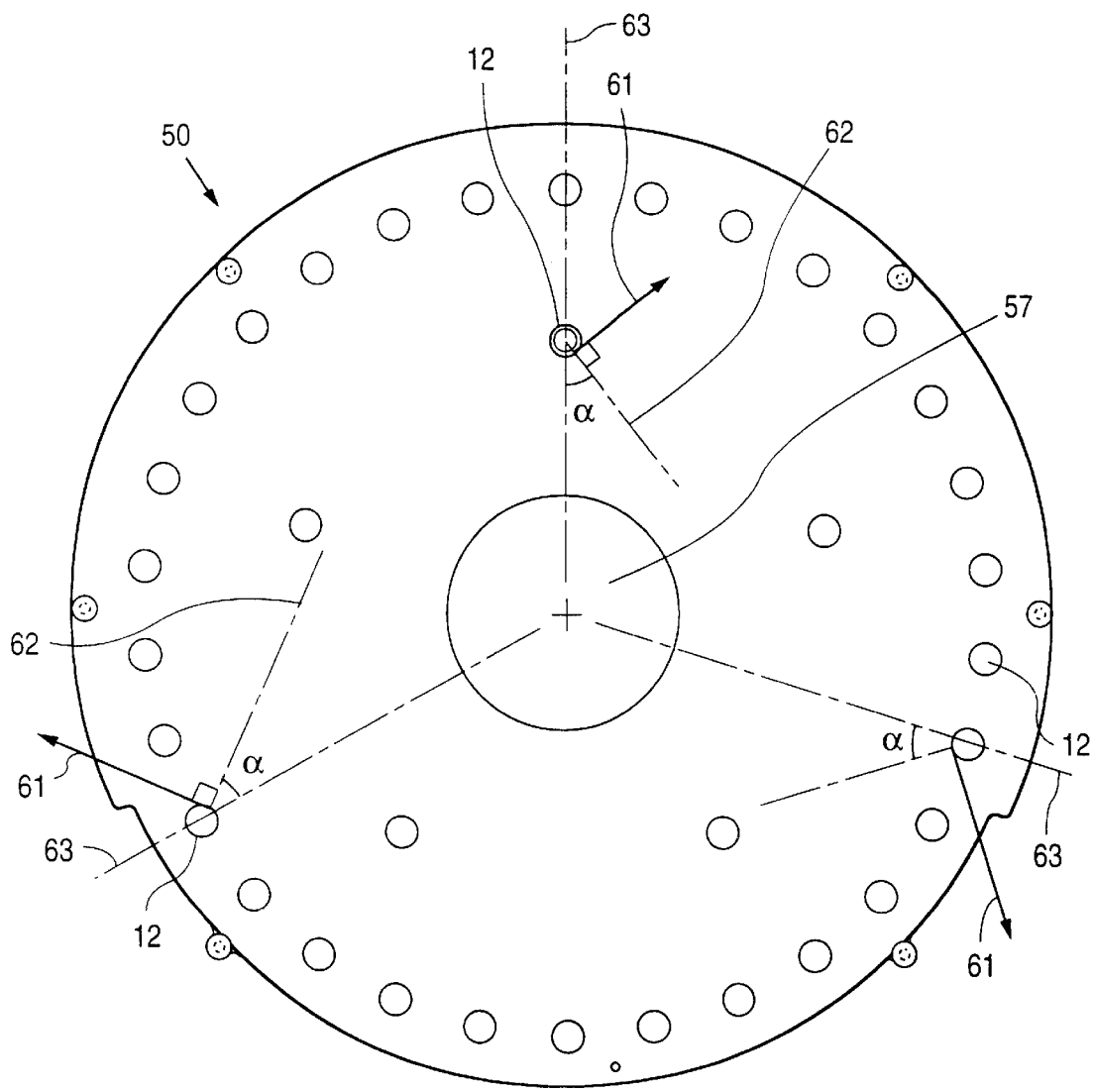
FIG. 6C illustrates the physical orientation of the vortex chucks of the wafer station shown in FIG. 6A.

In one embodiment, each vortex chuck 12 in station 50 is physically oriented such that the general direction of its exit gas is perpendicular to a line which is at an angle α with respect to another line that extends radially from the center of station 50. Direction 61 of the exit gas of each vortex chuck 12 in station 50 is schematically shown in the top view of FIG. 6C, wherein only some vortex chucks 12 are used for illustration in the interest of clarity. As shown in FIG. 6C, direction 61 of the exit gas is generally perpendicular to line 62, which is at an angle α with respect to line 63. In one example, angle α is 10° to 45°. This physical orientation of vortex chucks 12 has been found to be optimum for holding a wafer in a circular station 50. Note that the above described physical orientation of vortex chucks 12 can also be made with direction 61 pointing in the counter-clockwise direction (by locating angle α on the other side of line 63, for example).

Hand-off sequences for transferring a wafer from end-effector 10 to station 50 and vice versa are now described. In the following description, "ON" indicates that gas pressure sufficient to firmly hold a wafer is provided to vortex chucks 12 while "OFF" indicates that there is no gas pressure to vortex chucks 12. To transfer a wafer from end-effector 10 to station 50:

(a) Station 50 is turned OFF.
(b) End-effector 10 is positioned such that the supported wafer is 0.05" to 0.35" from top plate 51 of station 50 (FIG. 5).
(c) Station 50 is turned ON.
(d) End-effector 10 is turned OFF, thus transferring the wafer to station 50. Similarly, to transfer a wafer from station 50 to end-effector 10:
(a) End-effector 10 is turned OFF.
(b) End-effector 10 is positioned such that its bottom plate 14 is 0.05" to 0.35" from the wafer supported by station 50 (see FIG. 5).
(c) End-effector 10 is turned ON.
(d) Station 50 is turned OFF, thus transferring the wafer to end-effector 10.

In both hand-off sequences described above, wafer transfer is smoothest when step (c) is performed by abruptly (as opposed to gradually) turning off the handing vortex chucks 12. Further, some experimentation may be required to find the optimum "ON" gas pressure for a particular application. In one experiment, the gas pressure for turning ON station 50 was made slightly less than the gas pressure for turning ON end-effector 10 to prevent station 50 from overpowering end-effector 10.

Figure 7A:
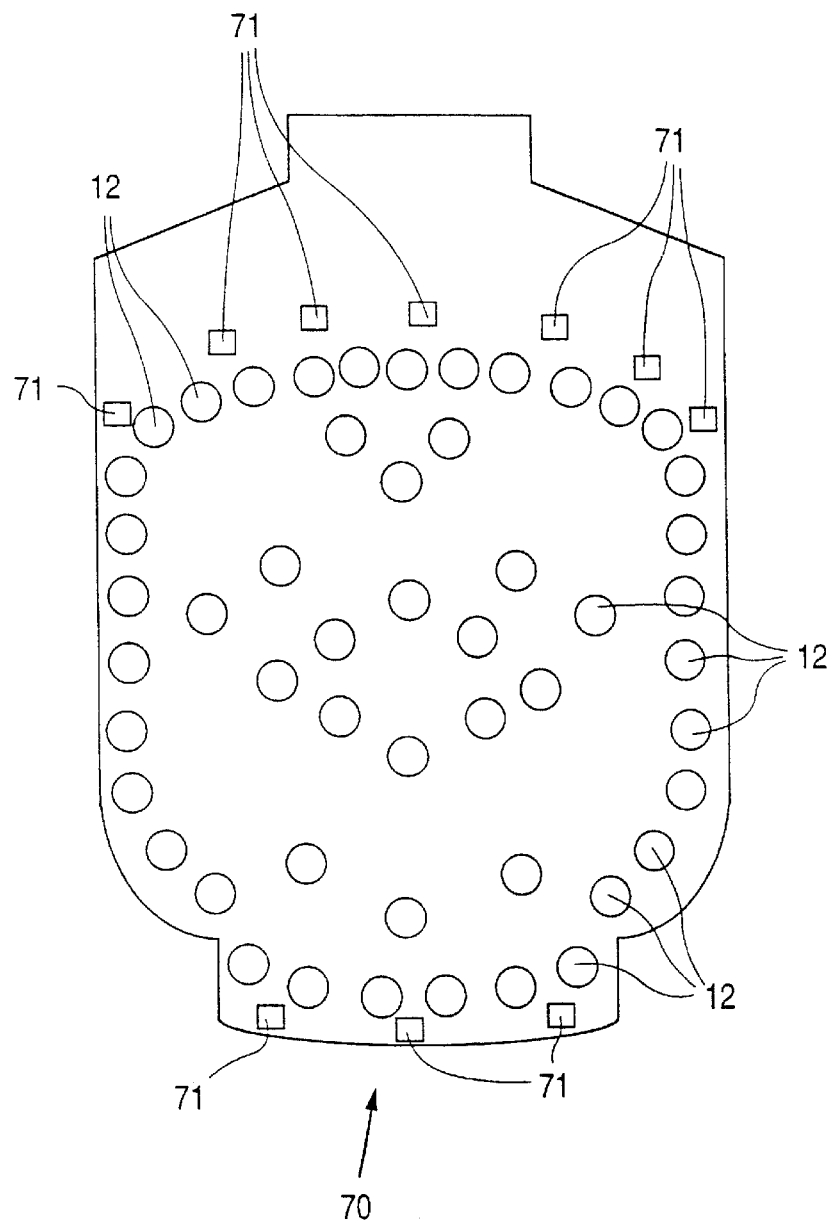
FIGS. 7A and 7B schematically show the top view and side view, respectively, of an end-effector in one embodiment.
Figure 7B:
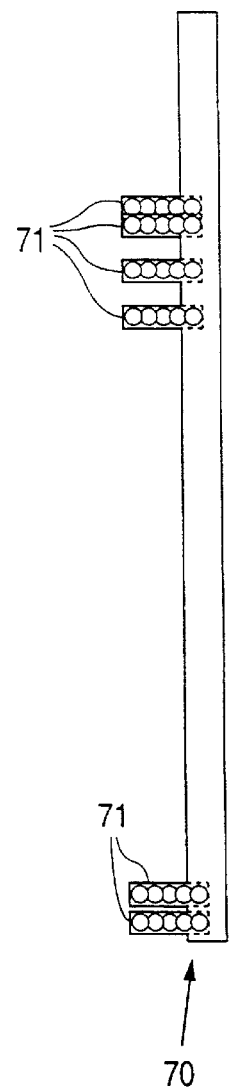

FIGS. 7A and 7B schematically show a top view and a side view, respectively of an end-effector 70. End-effector 70 is the same as end-effector 10 except that end-effector 70 uses retractable limiters 71 instead of fixed rear and front retaining lips to contain a supported wafer. Limiters 71 can be any retractable structure for limiting lateral movement including spring-loaded pins. Like end-effector 10, end-effector 70 supports a wafer using multiple vortex chucks 12 in its middle section and along its periphery.

Figure 8A:
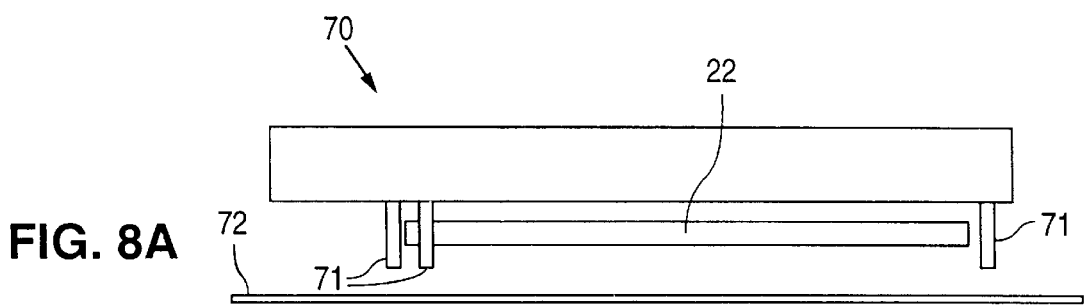
FIGS. 8A and 8B schematically illustrate an application of the end-effector shown in FIGS. 7A and 7B.
Figure 8B:
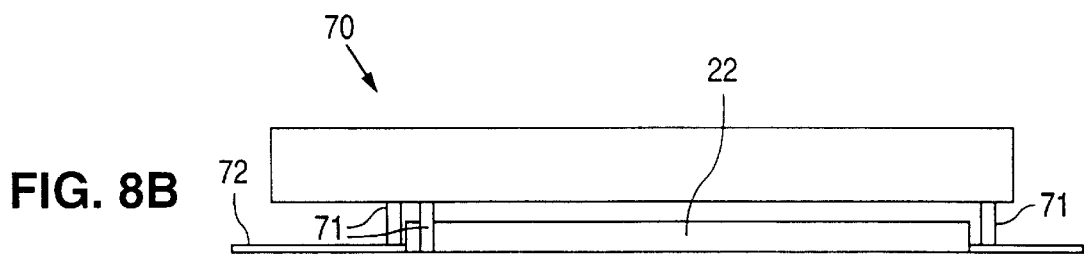

While end-effector 70 can be generally used to pick-up and support a wafer, it is specially useful in applications where the supported wafer needs to be pushed against a surface. An example of such application is schematically illustrated in FIGS. 8A and 8B. In FIG. 8A, wafer 22 supported by end-effector 70 is to be pressed against and attached onto a sticky tape 72 (also known as dicing tape or adhesive tape). Sticky tapes are well known in the semiconductor industry. As end-effector 70 is lowered down towards sticky tape 72, limiters 71 contact sticky tape 72 and retract to allow end-effector 70 to continue its downward movement. This enables wafer 22 to be pressed against sticky tape 72 as shown in FIG. 8B. Wafer 22 can be pressed against sticky tape 72 with sufficient force because the multiple vortex chucks 12 of end-effector 70 supply a high volume of gas between end-effector 70 and wafer 22.

While specific embodiments of this invention have been described, it is to be understood that these embodiments are illustrative and not limiting. Many additional embodiments that are within the broad principles of this invention will be apparent to persons skilled in the art.

What is claimed is:

1. An apparatus for supporting a wafer, the apparatus comprising:
   a first surface;
   one or more vortex chucks for emitting gas vortices from said first surface towards the wafer; and
   a plurality of retractable limiters on said first surface, said retractable limiters restricting the lateral movement of said wafer relative to said first surface, wherein the limiters are retractable to reduce an amount by which they extend from said first surface when the gas vortices press the wafer against another surface.

2. The apparatus of claim 1 wherein said one or more vortex chucks are a plurality of vortex chucks located along the periphery of said first surface.

3. The apparatus of claim 1 wherein the one or more vortex chucks are a plurality of vortex chucks.

4. A method comprising:
   emitting one or more gas vortices from a first surface towards an object to support the object, and restricting a lateral movement of the object relative to the first surface with at least one retractable limiter;
   pressing the limiter against a second surface to cause the limiter to retract;
   wherein pressing the limiter against the second surface comprises the gas vortices pressing the object against the second surface.

5. The method of claim 4 wherein the lateral movement of the object is restricted with plural retractable limiters, each of which retracts during the pressing operation.

6. The method of claim 5, wherein the second surface comprises an adhesive.

7. The method of claim 6, wherein the second surface is a sticky tape.

8. The method of claim 5, wherein the second surface immobilizes the object.

9. The method of claim 4, wherein the second surface comprises an adhesive.

10. The method of claim 9, wherein the second surface is a sticky tape.

11. The method of claim 4 wherein the one or more gas vortices are a plurality of gas vortices.

12. The method of claim 11, wherein the second surface comprises an adhesive.

13. The method of claim 11, wherein the second surface immobilizes the object.

14. The method of claim 4, wherein the second surface immobilizes the object.

* * * * *